(12) United States Patent
Camacho et al.

(10) Patent No.: US 8,722,457 B2
(45) Date of Patent: May 13, 2014

(54) SYSTEM AND APPARATUS FOR WAFER LEVEL INTEGRATION OF COMPONENTS

(75) Inventors: Zigmund R. Camacho, Singapore (SG);
Dioscoro A. Merilo, Singapore (SG);
Lionel Chien Hui Tay, Singapore (SG);
Henry Descalzo Bathan, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 1323 days.

(21) Appl. No.: 11/965,383

(22) Filed: Dec. 27, 2007

(65) Prior Publication Data
US 2009/0166825 A1 Jul. 2, 2009

(51) Int. Cl.
*H01L 21/00* (2006.01)

(52) U.S. Cl.
USPC ............ 438/107; 257/686; 257/E25.006

(58) Field of Classification Search
USPC ................................................ 438/107
See application file for complete search history.

(56) References Cited

U.S. PATENT DOCUMENTS

| | | | |
|---|---|---|---|
| 6,344,401 B1 | 2/2002 | Lam | |
| 6,933,598 B2 * | 8/2005 | Karnezos | 257/686 |
| 7,245,008 B2 | 7/2007 | Lee | |
| 7,335,986 B1 * | 2/2008 | Paek et al. | 257/723 |
| 7,435,619 B2 * | 10/2008 | Shim et al. | 438/107 |
| 2005/0186705 A1 * | 8/2005 | Jackson et al. | 438/106 |
| 2005/0194674 A1 * | 9/2005 | Thomas et al. | 257/690 |
| 2007/0178667 A1 | 8/2007 | Lee et al. | |

FOREIGN PATENT DOCUMENTS

| | | |
|---|---|---|
| TW | 200707679 | 2/2007 |
| TW | M318793 | 9/2007 |
| TW | 200739875 | 10/2007 |

* cited by examiner

*Primary Examiner* — Mark Tornow
(74) *Attorney, Agent, or Firm* — Robert D. Atkins; Patent Law Group: Atkins & Associates, P.C.

(57) ABSTRACT

In a semiconductor package, a substrate has an active surface containing a plurality of active circuits. An adhesive layer is formed over the active surface of the substrate, and a known good unit (KGU) is mounted to the adhesive layer. An interconnect structure electrically connects the KGU and active circuits on the substrate. The interconnect structure includes a wire bond between a contact pad on the substrate and a contact pad on the KGU, a redistribution layer on a back surface of the substrate, opposite the active surface, a through hole via (THV) through the substrate that electrically connects the redistribution layer and wire bond, and solder bumps formed in electrical contact with the redistribution layer. The KGU includes a KGU substrate for supporting the KGU, a semiconductor die disposed over the KGU substrate, and an encapsulant formed over the semiconductor die.

25 Claims, 15 Drawing Sheets

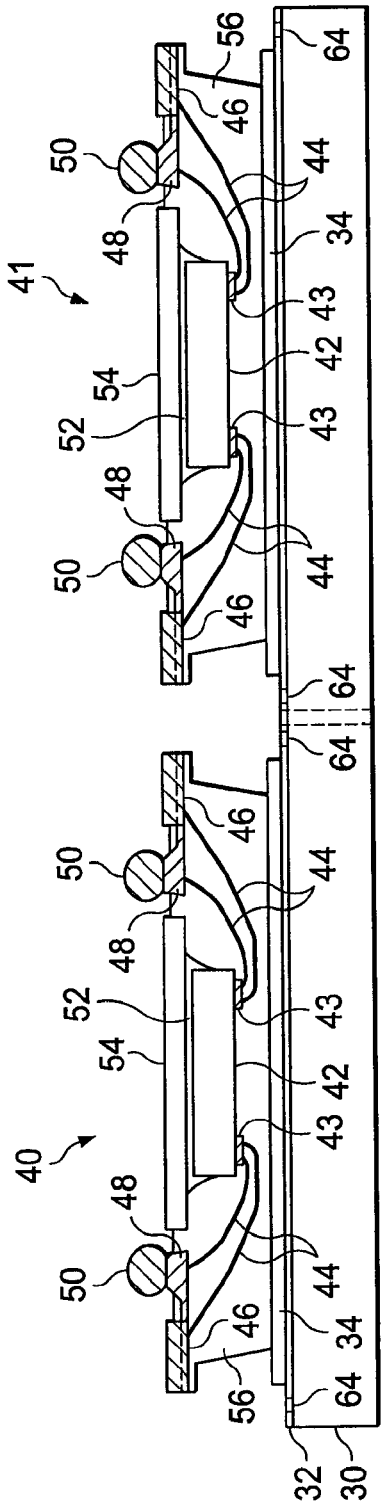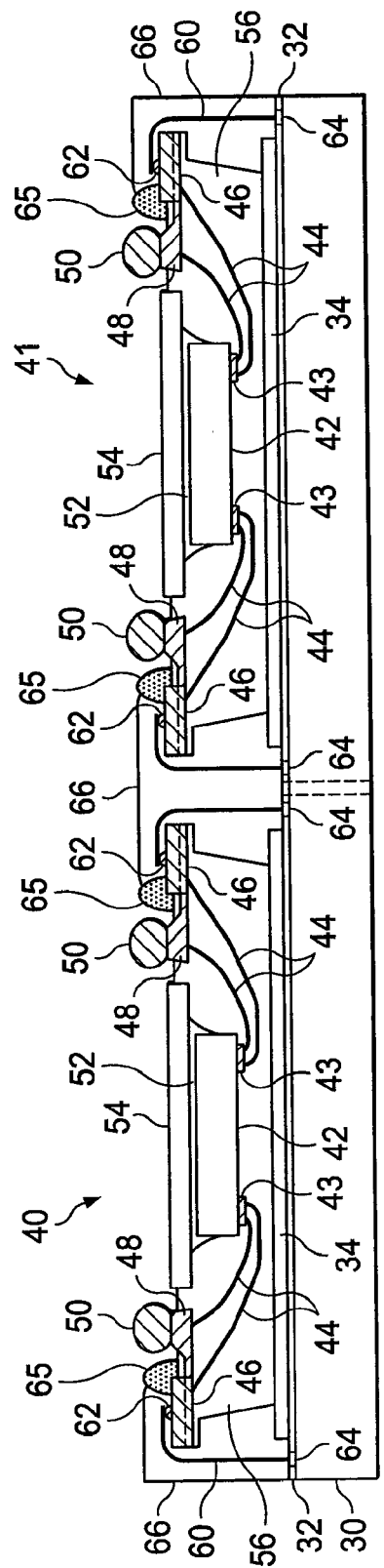
FIG. 2b
FIG. 2c

SYSTEM AND APPARATUS FOR WAFER LEVEL INTEGRATION OF COMPONENTS

FIELD OF THE INVENTION

The present invention relates in general to semiconductor devices and, more particularly, to wafer level integration of components.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and packaging the die for structural support and environmental isolation.

One goal of semiconductor manufacturing is to produce a package suitable for faster, reliable, smaller, and higher-density integrated circuits (IC) at lower cost. Flip chip packages, chip scale packages (CSPs), or wafer level chip scale packages (WLCSPs) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are soldered to the carrier substrate. The flip chip semiconductor package provides a short electrical conduction path from the active devices on the die to the carrier substrate in order to reduce signal propagation length, lower capacitance, and achieve overall better circuit performance.

In many applications, it is desirable to achieve wafer level die integration between two or more semiconductor devices. Some applications, for example, require the integration of large integrated circuit chips with packaged known good units. Alternative applications may require further integration of passive or other components to form a system-in-package module.

SUMMARY OF THE INVENTION

In one embodiment, the present invention is a method of making a semiconductor package, comprising providing a substrate having an active surface containing a plurality of active circuits, forming an adhesive layer over the active surface of the substrate, mounting a known good unit (KGU) to the adhesive layer, and forming an interconnect structure to electrically connect the KGU and active circuits on the substrate by (a) providing a wire bond between a contact pad on the substrate and a contact pad on the KGU, (b) forming a redistribution layer on a back surface of the substrate, opposite the active surface, (c) forming a through hole via (THV) through the substrate to electrically connect the redistribution layer and wire bond, and (d) forming solder bumps in electrical contact with the redistribution layer.

In another embodiment, the present invention is a method of making a semiconductor package, comprising providing a substrate having an active surface containing a plurality of active circuits, forming an adhesive layer over the active surface of the substrate, mounting a known good unit (KGU) to the adhesive layer, and forming an interconnect structure to electrically connect the KGU and active circuits on the substrate.

In another embodiment, the present invention is a method of making a semiconductor package, comprising providing a substrate, mounting a first surface of a known good unit (KGU) to a first surface of the substrate, forming a first interconnect structure to electrically connect the KGU and substrate, forming a second interconnect structure on a second surface of the substrate, opposite the first surface of the substrate, and forming a third interconnect structure on a second surface of the KGU, opposite the first surface of the KGU.

In another embodiment, the present invention is a semiconductor package, comprising a substrate having an active surface containing a plurality of active circuits, an adhesive layer formed over the active surface of the substrate, a known good unit (KGU) mounted to the adhesive layer, and an interconnect structure electrically connecting the KGU and active circuits on the substrate.

BRIEF DESCRIPTION OF THE DRAWINGS

FIGS. 2a-2d illustrate a method of manufacturing a semiconductor package;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
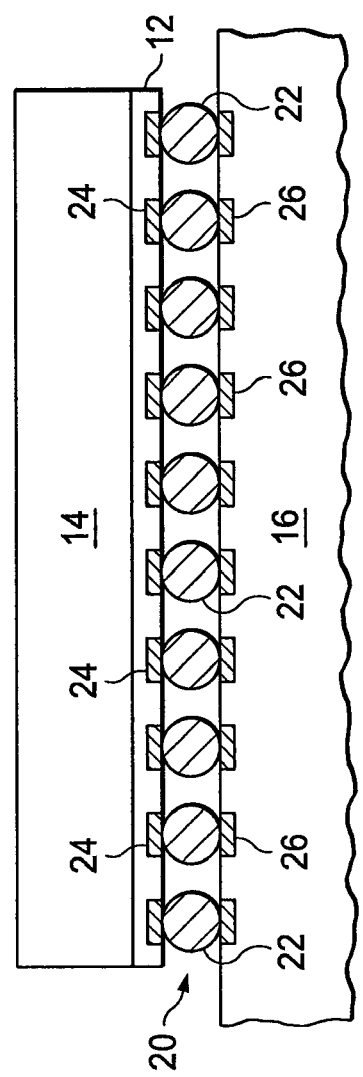
FIG. 1 is a flip chip semiconductor device with solder bumps providing electrical interconnect between an active area of the die and a chip carrier substrate.

Semiconductor packages, wafer level packages (WLP) and chip-scale packages (CSP) are commonly used with integrated circuits (ICs) demanding high speed, high density, and greater pin count. Flip chip style semiconductor device 10 involves mounting an active area 12 of die 14 face down toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive solder bumps or balls 22. The solder bumps are formed on bump pads or interconnect sites 24, which are disposed on active area 12. Bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation length, lower capacitance, and achieve overall better circuit performance.

Figure 2A:
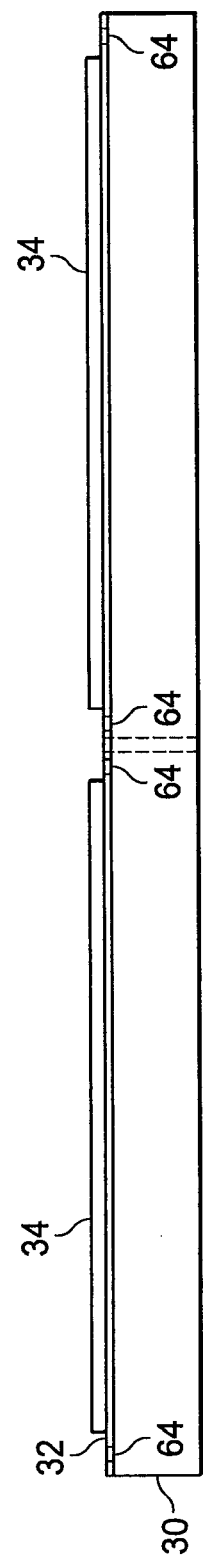

Turning to FIG. 2a a first step in a manufacturing process for a chip scale package (CSP), or wafer level chip scale package (WLCSP) is shown. Wafer or substrate 30 is formed with passivation 32 disposed over its top surface. Passivation 32 may include polyimide, benzocyclobutene (BCB) or polybenzoxazoles (PBO). Wafer 30 includes a silicon or other bulk semiconductor material and includes a relatively large die such as one for a processor, microcontroller, or digital signal processor (DSP). An active area formed within wafer 30 contains active and passive devices, conductive layers, and dielectric layers according to the electrical design of the device. An adhesive layer 34 is disposed over passivation 32 of wafer 30 and includes a thermal epoxy. In alternative embodiments, wafer 30 is replaced with a wafer level package or other semiconductor die package. Contact pads 64 are formed over wafer 30 using an electrolytic plating or electroless plating process and include a conductive material. Contact pads 64 are in electrical connection with one or more of the devices formed within the active area of wafer 30. The formation of contact pads 64 may further include etching passivation 32 to form openings over which conductive material is deposited. Contact pads 64 may be further optimized for gold bonding by forming an additional metal layer over contact pads 64. The additional metal layer includes aluminum (Al) or another common contact pad material that is bondable with gold (Au).

Turning to FIG. 2b, known-good units (KGUS) or packages 40 and 41 are attached to adhesive layer 34 and electrically connected to wafer 30 (as shown in FIG. 2c). Packages 40 and 41 comprise one or more pre-packaged semiconductor die and include contact pads for connecting packages 40 and 41 to external systems. The packages include general application integrated circuits such as filters, memory chips, and processors. After the packages are connected using the present method, the devices and systems contained within packages 40 and 41 are put into communication with the devices formed within wafer 30. Because the functionality of packages 40 and 41 is made available to wafer 30 and the devices therein, wafer 30 need not include that additional functionality and its design is simplified. Using the present method, therefore, a wafer 30 that requires specific functionality already provided by an existing package can incorporate that functionality directly without the need for additional circuitry formed within the wafer.

FIG. 2b depicts an exemplary construction of packages 40 and 41. Packages 40 and 41 include dual-row quad-flat non-leaded (QFN) molded packages and are fully assembled and packaged before being integrated with wafer 30. Packages 40 and 41 include semiconductor die 42. Semiconductor die 42 include an active surface containing active and passive devices, conductive layers, and dielectric layers according to the design of semiconductor die 42.

Semiconductor die 42 include contact pads 43 in electrical contact with the active area of semiconductor die 42. Contact pads 43 are formed by a deposition process such as an electrolytic plating or electroless plating process. Contact pads 46 and 48 are formed on an exterior surface of packages 40 and 41. Wires 44 form an electrical connection between contact pads 43 and contact pads 46 and 48.

Contact pads 46 and 48 form an outer and inner row of connection pads, respectively, that electrically connect packages 40 and 41 to other components. Contact pads 46 and 48 are connected to other components using solder bumping or wire bonding.

Die-attach adhesive 52 connects semiconductor die 42 and die-attach paddle or die pad 54. Die pad 54 and contact pads 46 and 48 form part of the copper leadframe of packages 40 and 41 and facilitate electronic connection of the packages to other system components. Encapsulant or mold compound 56 is deposited over semiconductor die 42 and wires 44 to provide further mechanical support and protection to the components of packages 40 and 41.

With reference to FIG. 2b, solder bumps 50 are formed over connection pads 48. Bumps 50 are formed using a solder reflow process applied to solder material deposited upon contact pads 48. In one embodiment, bumps 50 are formed on contact pads 48 before packages 40 and 41 are connected to wafer 30. In an alternative embodiment, bumps 50 are formed after packages 40 and 41 are connected to wafer 30. The solder material is deposited using a ball drop or stencil printing process. The solder material used to form bumps 50 includes Au, or Cu structures or another conductive material such as tin/lead (Sn/Pb), Copper/Zinc (CuZn), or Copper/Silver (CuAg) solder, each containing an optional flux material. An optional under-bump metallization (UBM) may be formed beneath bumps 50 over contact pads 48 to enhance the physical and electrical connection between contact pads 48 and bumps 50. The UBM is formed by first etching a portion of contact pads 48 and applying one or more metal layers using a vacuum deposition by evaporation or sputtering process or a chemical plating process. The UBM layers include a conductive material such as titanium (Ti), nickel vanadate (NiV), or Cu having thicknesses of approximately 1000 Å, 3250 Å, and 8000 Å, respectively. For copper, etchants include A70 with about 11.15% nitric acid (HNO3) and 6.3% acetic acid (CH3COOH) or A75 with about 75.7% phosphoric acid (H3PO4) and 7.35% acetic acid (CH3COOH). The etchant for titanium can be 1.67% hydrogen fluoride with 1.67% hydrogen peroxide and remaining water.

Figure 2D:
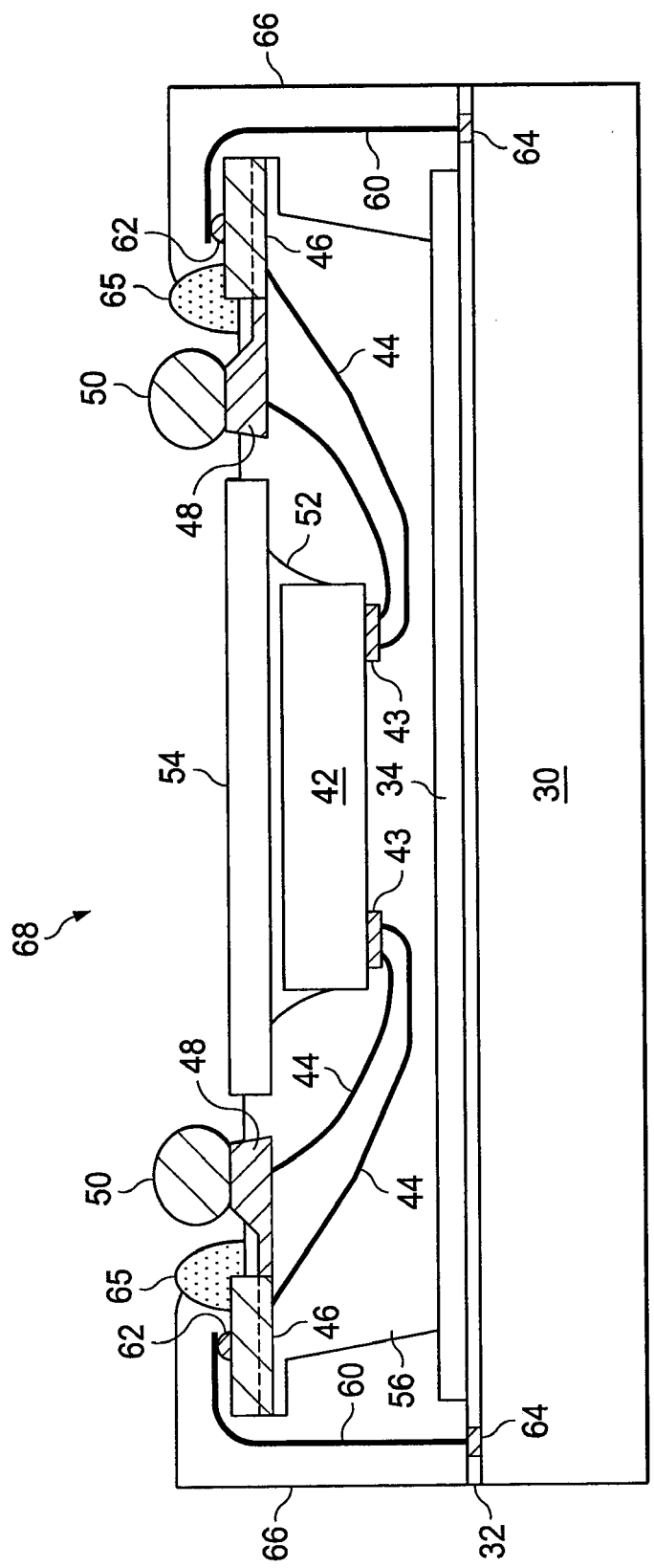

With reference to FIG. 2c, a wire bonding interconnect is formed between packages 40 and 41 and wafer 30. Wires 60 electrically connect contact pads 46 of packages 40 and 41 and contact pads 64. Accordingly, devices formed within wafer 30 are connected to the devices formed within semiconductor die 42. Wires 60 connect directly to contact pads 64, but connect to contact pads 46 via bumps 62. Bumps 62 are formed using a solder bump process as described above. Wires 60 are connected to bumps 62 using a process that uses heat, pressure, and/or ultrasonic energy to form a mechanical and electrical bond. In alternative embodiments, wires 60 connect directly to contact pads 46 with no intervening bumps. Encapsulant or conformal coating 66 is deposited over packages 40 and 41, wafer 30, and wires 60 to provide physical support and electrical isolation. Encapsulant 66 includes an electrically resistive material and is deposited using printing or compressive molding processes. An optional resin dam 65 is deposited over packages 40 and 41 before the deposition of encapsulant 66 to control the placement of encapsulant 66. In FIGS. 2c and 2d, resin dam 65 controls the flow of encapsulant 66 and prevents encapsulant 66 from flowing over contact pads 48.

Turning to FIG. 2d, wafer 30 is singulated to separate individual die formed on wafer 30 and packages 40 and 41. FIG. 2d shows a single die 30 having a single package 68 connected thereon. In alternative embodiments, however, a single die is connected to multiple packages via one or more adhesive layers.

Figure 3:
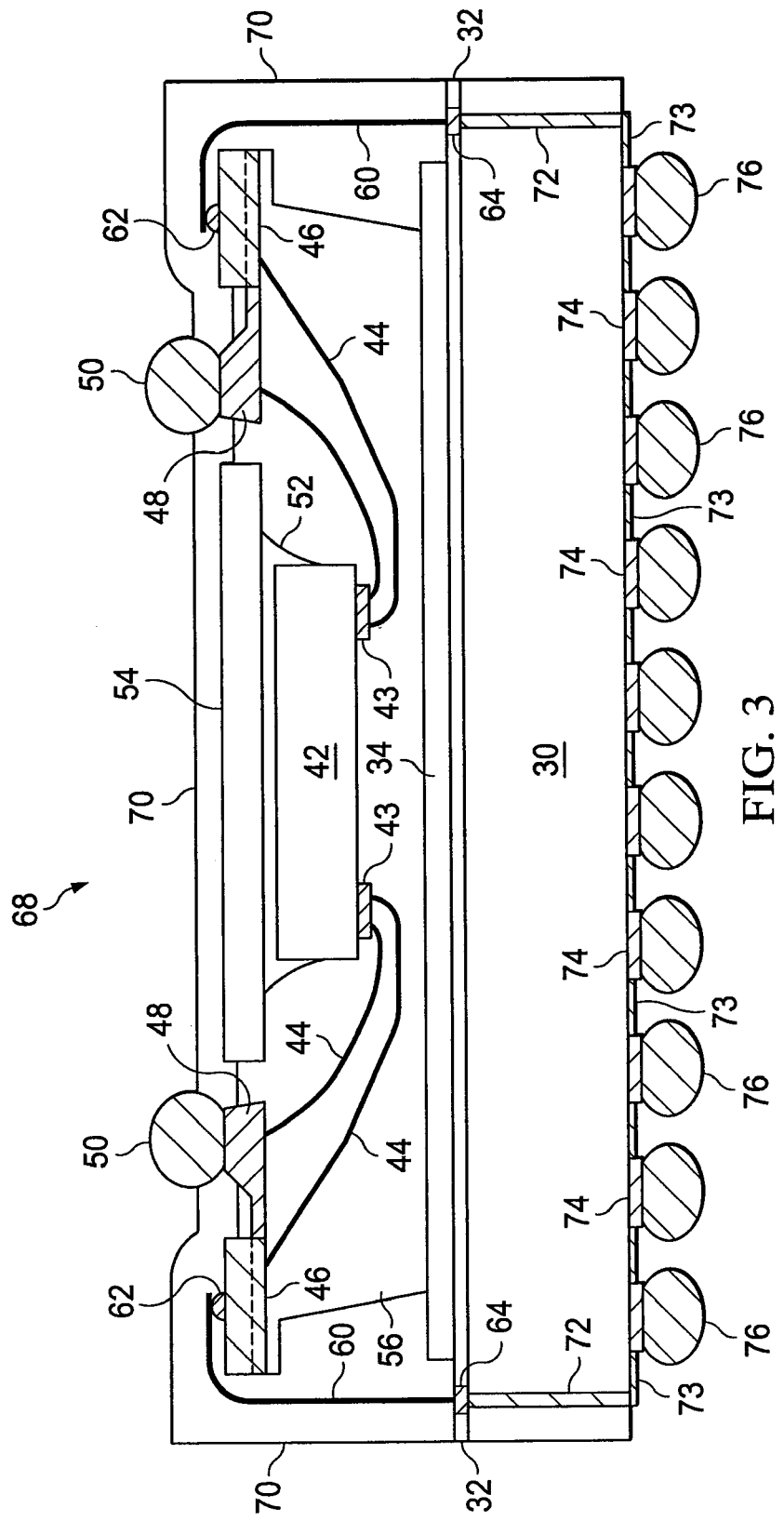
FIG. 3 illustrates a semiconductor package with a redistribution layer.

FIG. 3 shows package 68 connected to wafer 30 with adhesive layer 34. Encapsulant, mold compound, or dam fill 70 is formed over package 68 to provide physical support and electrical insulation. Encapsulant 70 is deposited as a full conformal coating and is, accordingly, formed around bumps 50 as shown on FIG. 3. An RDL 73 is formed on the backside of wafer 30 to connect wafer 30 to other system components. Through hole vias (THVS) 72 are formed in wafer 30 by etching or laser drilling and depositing conductive material over the hole using an evaporation, electrolytic plating, electroless plating, or screen printing process to electrically connect contact pads 64 and semiconductor die 42 to RDL 73. Accordingly, THVs 72 electrically connect the devices formed within semiconductor die 42 to RDL 73 and external components connected to RDL 73. An organic epoxy material may be deposited within THVs 72 to provide additional mechanical support to contact pads 64. Additional mechanical support may be important, for example, if the formation of THVs 72 results in an unstable substructure below one or more contact pads 64. To facilitate connection to external components, solder bump contact pads 74 are formed on the backside of wafer 30 and in electrical connection with RDL 73. Contact pads 74 are formed by a deposition process such as an electrolytic plating or electroless plating process. Contact pads 74 include a conductive material such as Al, aluminum alloys, Copper (Cu), Nickel (Ni), Au, Silver (Ag), salicide, or polysilicon. Contact pads 74 may further include an optional UBM. Bumps 76 are deposited on contact pads 74 or optional UBM. Bumps 76 include a solder bump material as described above and are reflowed to form an electrical and mechanical connection between contact pads 74 and bumps 76.

Figure 4:
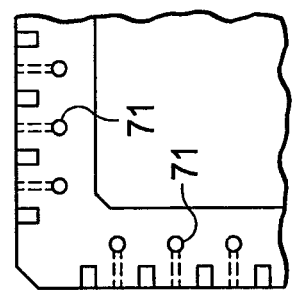
FIG. 4 illustrates a contact pad configuration for a semiconductor device.

FIG. 4 shows an example pin configuration for a KGU or package having a QFN connection configuration. In FIG. 4, the KGU or package includes a dual row of connection pads with an internal row including connection pads 71 having an approximately circular shape. The circular shape facilitates the mounting of balled devices to the KGU or package.

Figure 5:
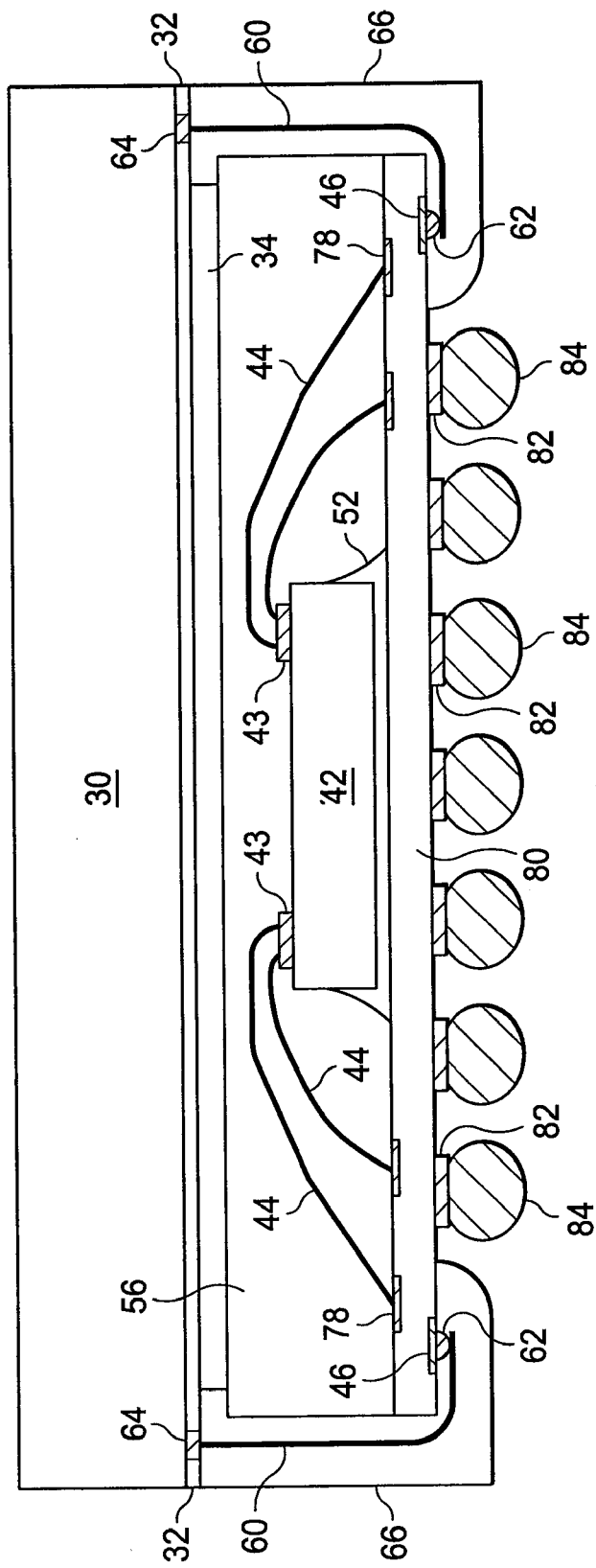
FIG. 5 illustrates a semiconductor package with an inner package having input-output terminals.

FIG. 5 depicts an exemplary embodiment of device 10 showing a KGU that has ball grid array (BGA) packaging and is mounted over wafer 30. Within the KGU, contact pads 78 are formed on a surface of substrate or printed circuit board (PCB) 80. Semiconductor die 42 is physically mounted on substrate 80 with die-attach adhesive 52 and is electrically connected to contact pads 78 via wires 44 that are connected to contact pads 43. On a second surface of substrate 80, contact pads 82 are formed. Contact pads 78 and contact pads 82 include a conductive material and are formed by an electrolytic plating or electroless plating process. Contact pads 82 may further include a UBM formed over the surface of contact pads 82. Contact pads 78 and contact pads 82 are in electrical connection depending upon the configuration of interconnection or conductive layers formed within substrate 80. Bumps 84 are formed upon the KGU and are connected to connection pads 82 or optional UBM. Bumps 84 facilitate the electrical connection of the KGU or package to external components of the system. In this configuration, semiconductor die 42 may be connected to external components without the formation of a THV in wafer 30 thereby simplifying the manufacture of the device.

Figure 6:
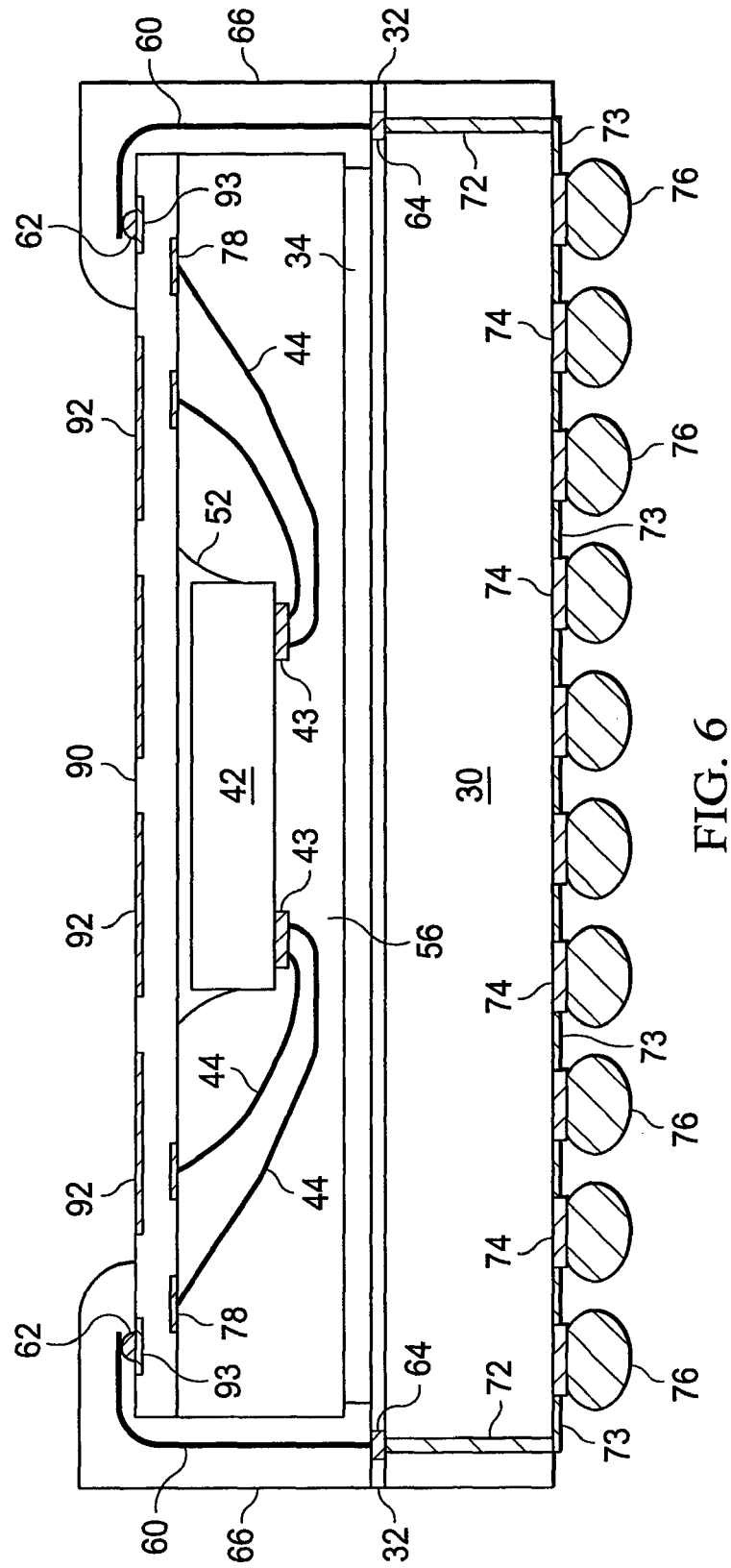
FIG. 6 illustrates a semiconductor package with backside rerouting.

FIG. 6 shows device 10 with an integrated KGU having backside input/output rerouting. Within the KGU, semiconductor die 42 is electrically connected to contact pads 78 formed on a surface of substrate or PCB 90 via wires 44. On a second surface of substrate 90, contact pads 92 are formed. Contact pads 92 are in electrical connection with contact pads 78 depending upon the interconnection structure of substrate 90. Contact pads 92 are connected to one or more of the devices formed within semiconductor die 42. Contact pads 78 and contact pads 92 include a conductive material and are formed by an electrolytic plating or electroless plating process. Contact pads 92 may further include a UBM formed over a surface of contacts pads 92. Contact pads 93 are formed on the second surface of substrate 90 and are in electrical connection with contact pads 78 and thereby one or more of the devices formed within semiconductor die 42. Bumps 62 are formed on the KGU and are connected to contact pads 93 using a suitable deposition process and material as described above. Wires 60 are connected to bumps 62 and contact pads 64 that are formed over passivation 32 of wafer 30. THVs 72 are formed in wafer 30 and electrically connect contact pads 64 and RDL 73 formed over a backside of wafer 30. Contact pads 74 are formed over the backside of wafer 30 using a deposition process. Bumps 76 are connected to contact pads 74 or an optional UBM formed over contact pads 74.

Figure 7:
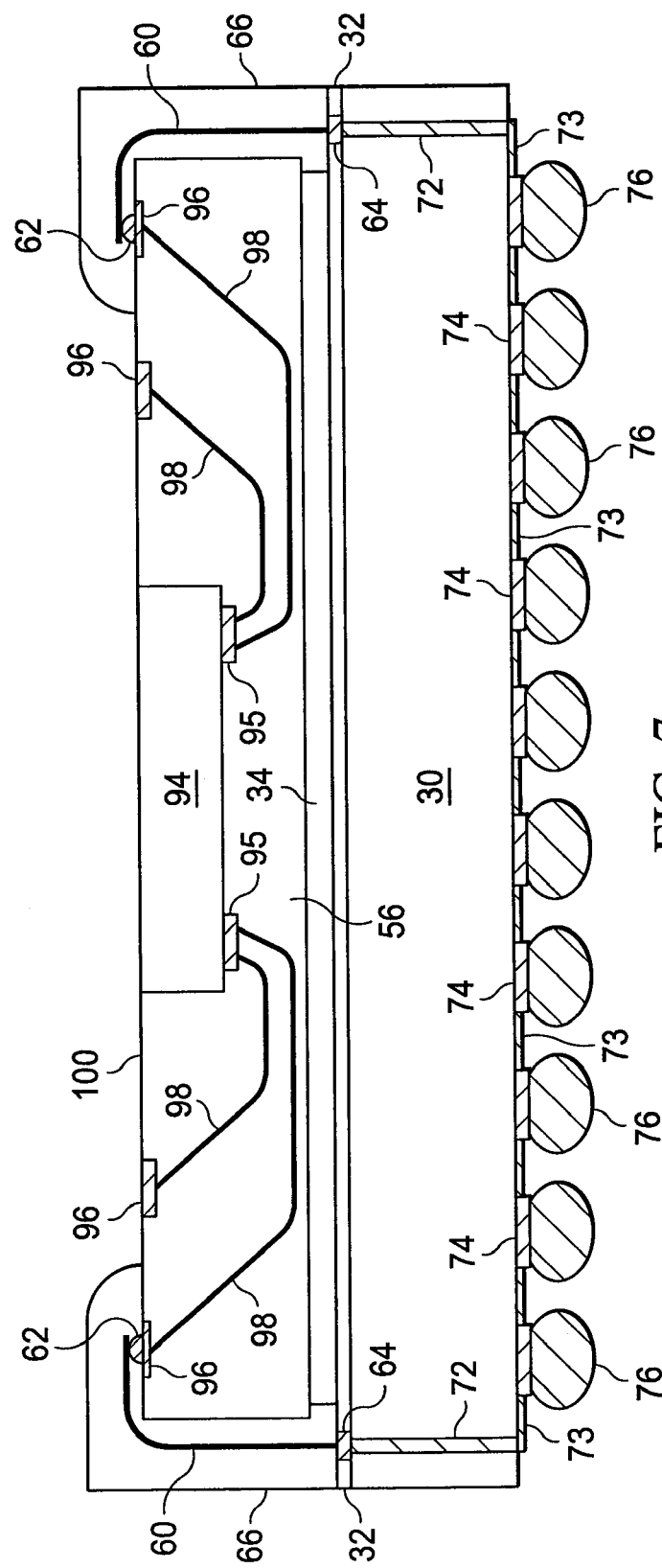
FIG. 7 illustrates a semiconductor package containing a low-profile, fine-pitch internal stacking module.

FIG. 7 depicts low-profile, fine-pitch internal stacking module (LFISM) 94 as the inner package in a KGU that is connected to wafer 30. Within the KGU, contact pads 95 are formed on a surface of LFISM 94. Contact pads 95 are in electrical contact with one or more of the devices formed within LFISM 94. Contact pads 95 include a conductive material and are formed using an electrolytic plating or electroless plating process. Contact pads 96 are formed proximate to an outer surface of the KGU over encapsulant 100. Encapsulant 100 includes an insulative material as described above and is deposited over LFISM 94 to provide physical support and electrical insulation. Wires 98 are bonded to contact pads 95 and 96 and provide for electrical connectivity between contact pads 96 and devices formed within LFISM 94. Bumps 62 are formed on one or more of contact pads 96 using a suitable solder bump deposition and reflow process. Outside the KGU, wires 60 are connected to bumps 62 and contact pads 64 formed on wafer 30. THVs 72 are formed in wafer 30 proximate to contact pads 64 to electrically connect contact pads 64 and RDL 73. Contact pads 74 are formed on a backside of wafer 30 and are electrically connected to RDL 73 and bumps 76 that are formed over contact pads 74. Additional system components may be connected to bumps 76 and placed in electrical communication with the devices formed within the KGU and, specifically, LFISM 94.

Figure 8:
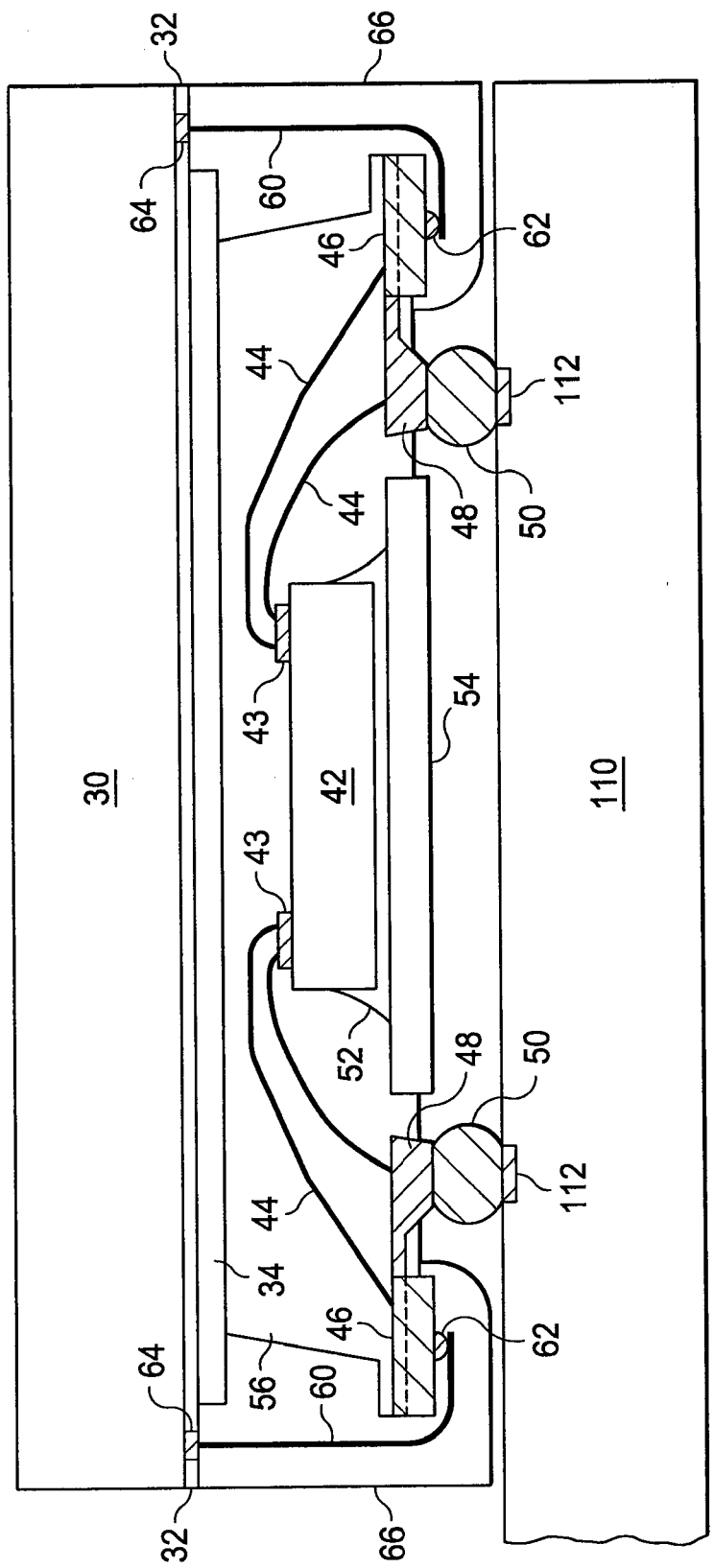
FIG. 8 illustrates a mounted semiconductor package.

Turning to FIG. 8, device 10 is shown mounted to PCB 110. PCB 110 includes laminate materials such as FR-4, polyimide, BT-epoxy and conductive materials such as Cu foil, conductive inks, Au, or Ag. Contact pads 112 are formed on a surface of PCB 110 using an electrolytic plating or electroless plating process. Contact pads 112 include a conductive material such as Al, aluminum alloys, Cu, Ni, Au, Ag, salicide, or polysilicon. An optional UBM may be formed over contact pads 112. Bumps 50 are connected to contact pads 48 and contact pads 112 using a solder reflow process.

Figure 9:
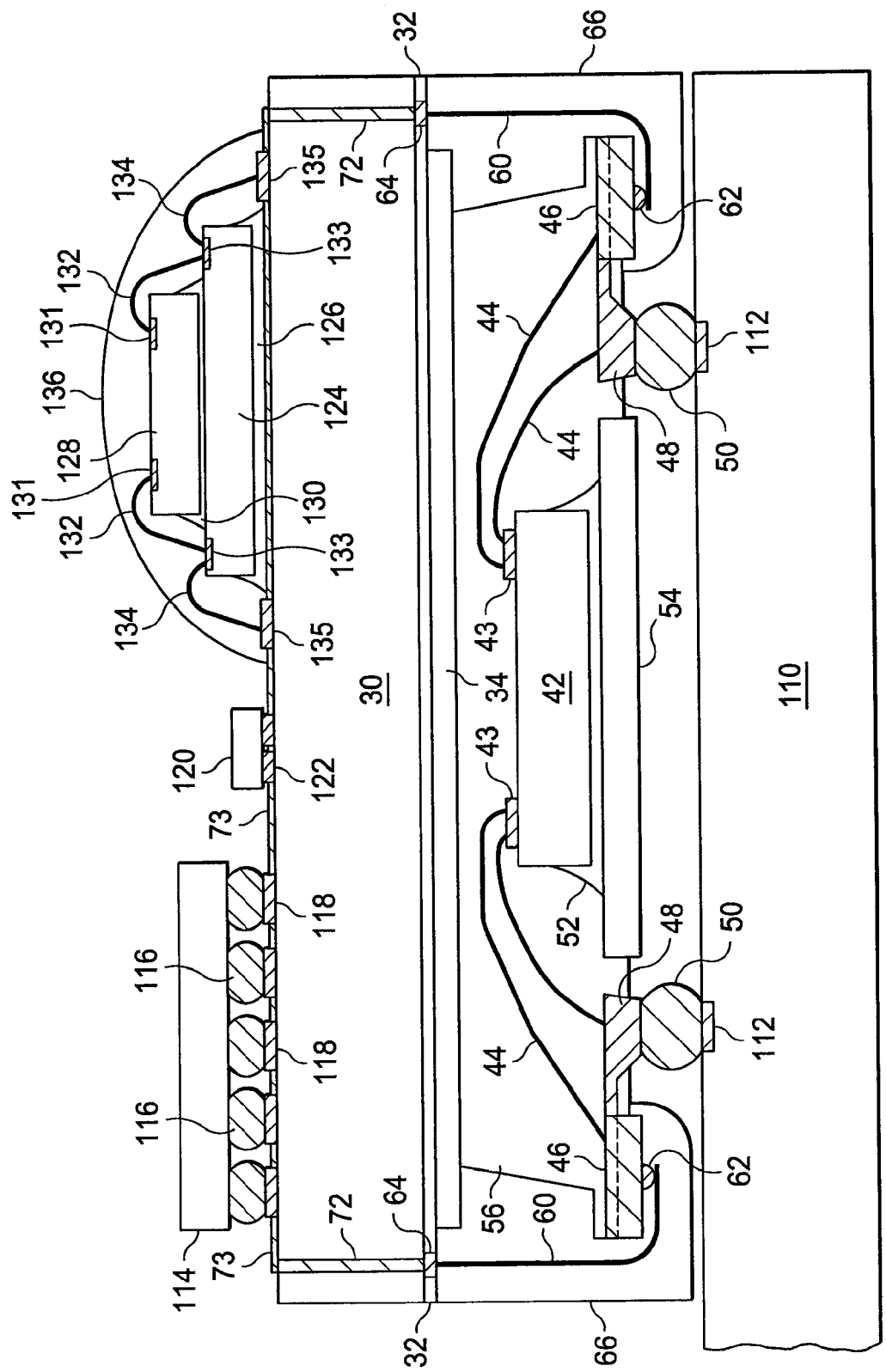
FIG. 9 illustrates a semiconductor package with attached discrete components.

Turning to FIG. 9, additional system components are connected to wafer 30 and are placed in electrical communication with the devices formed within the KGU. Component 114 is a discrete component that is connected to wafer 30 and may include a memory IC, filter IC, microcontroller, processor, CSP, or wafer-level chip-scale package (WLCSP). Component 114 is connected to wafer 30 using a BGA, PGA, flip-chip design, other surface mount technology (SMT) or lead-based mounting technology. In FIG. 9, component 114 is connected to contact pads 118 of wafer 30 via bumps 116. Contact pads 118 include a conductive material and are formed using a deposition process. Contact pads 118 are in electrical connection with devices formed within wafer 30, RDL 73, or THVs 72. An optional UBM may be formed on contact pads 118 to enhance the physical and electrical connection between contact pads 118 and bumps 116.

Passive device 120 is connected to contact pads 122 using an appropriate SMT. Passive device 120 includes resistors, capacitors, inductors, diodes, filters or combinations thereof. Contact pads 122 are formed on a surface of wafer 30 and include a conductive material such as Al, aluminum alloys, Cu, Ni, Au, Ag, salicide, or polysilicon. Contact pads 122 are in electrical contact with one or more devices formed within wafer 30, RDL 73, or THVs 72.

Component 124 is mounted over wafer 30 with underfill material 126. Underfill material 126 provides physical support to component 124 and acts as a heat bridge between wafer 30 and component 124. Over component 124, component 128 is similarly mounted using underfill material 130. Contact pads 131 are formed on a surface of component 128. Wires 132 are bonded to contact pads 131 and contact pads 133. Contact pads 133 are formed on a surface of component 124. Wires 134 are bonded to contact pads 133 and contact pads 135 that are formed on a surface of wafer 30. Contact pads 131, 133, and 135 include conductive material such as Al, aluminum alloys, Cu, Ni, Au, Ag, salicide, or polysilicon. Contact pads 135 are formed in electrical contact with one or more devices formed within wafer 30, RDL 73, or THVs 72. Encapsulant or conformal coating 136 is deposited over components 124 and 128. Encapsulant 136 provides physical protection and electrical isolation for components 124 and 128. In alternative embodiments, different combinations of components including passive and active components are connected to wafer 30 using flip-chip, wire bond, BGA, or PGA mounting processes.

Figure 10:
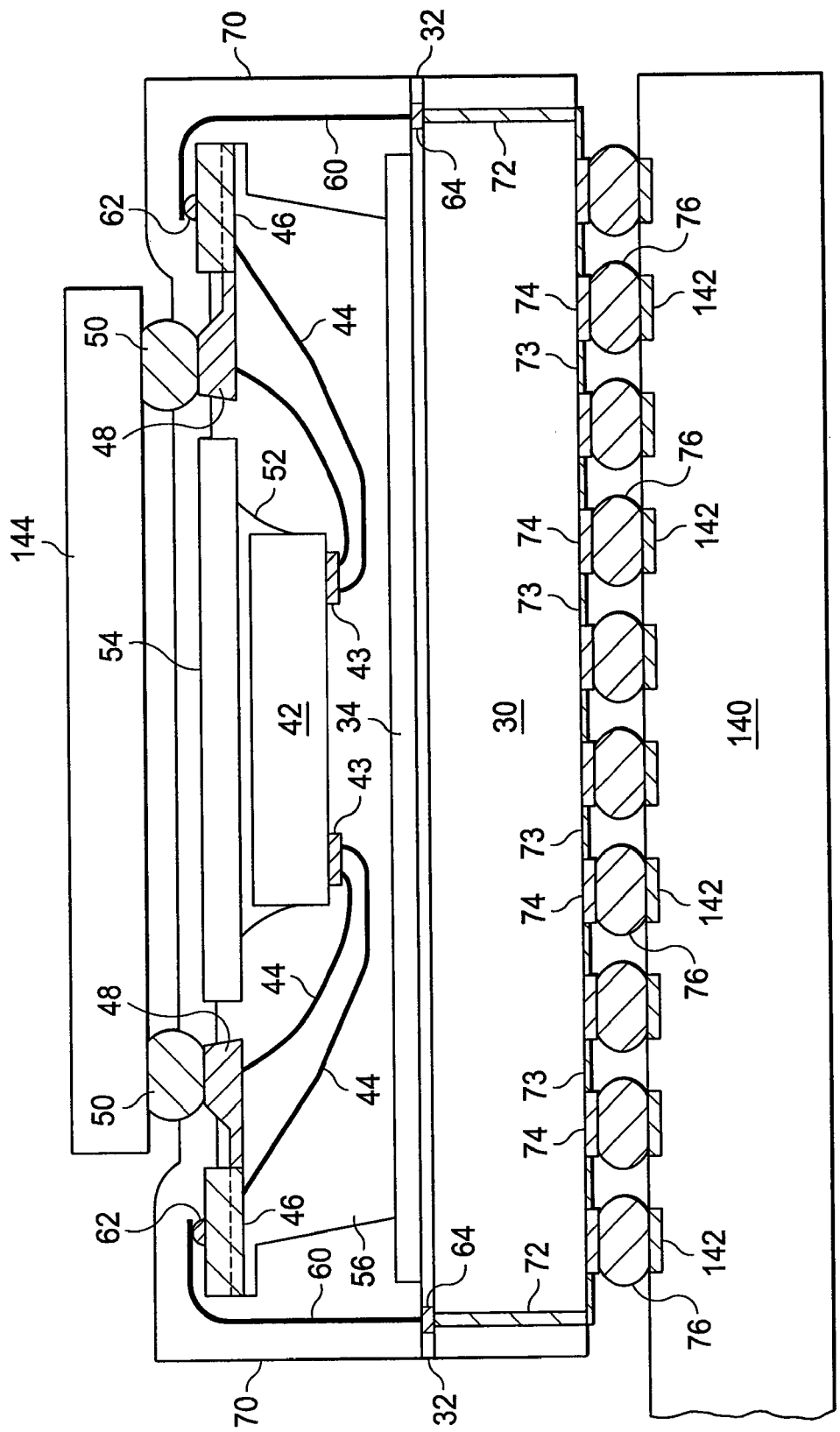
FIG. 10 illustrates a semiconductor package with a single attached discrete component.

Turning to FIG. 10, device 10 is shown mounted on PCB 140. Contact pads 142 are formed on a surface of PCB 140 by an appropriate deposition process such as an electrolytic plating or electroless plating process. Bumps 76 are connected to contact pads 74 and contact pads 142. Bumps 76 are formed using a solder bump material as described above. External package 144 is mounted to bumps 50 formed over connection pads 48. Bumps 50 are in electrical connection with wires 44 and devices formed within semiconductor die 42. In an alternative embodiment, package 144 is mounted to contact pads 48 using BGA, LGA, flip chip or other mounting process. Package 144 includes a CSP, WLCSP, package-in-package (PIP), or other package or IC containing one or more active or passive devices.

Figure 11:
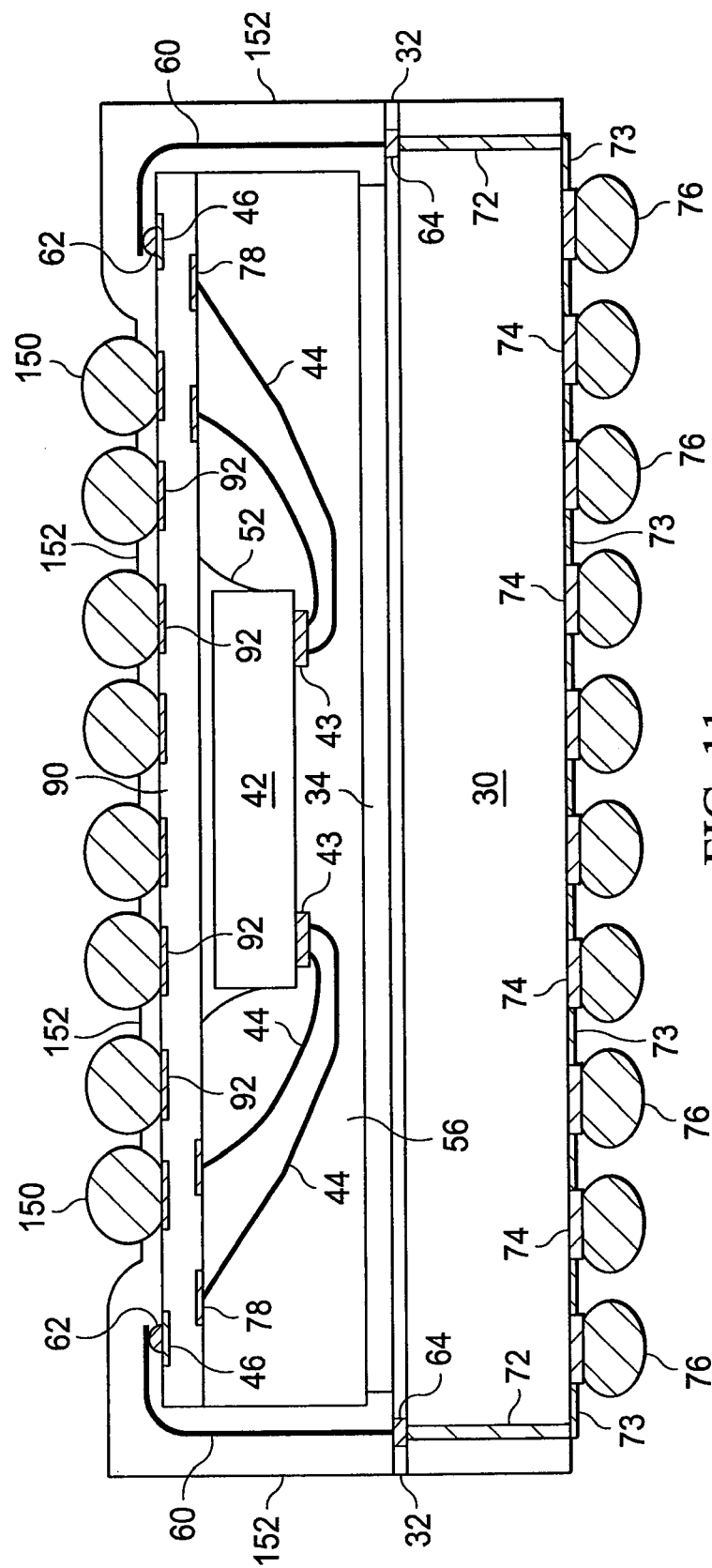
FIG. 11 illustrates a stackable semiconductor package.

In FIG. 11 bumps 150 are connected to contact pads 92. Bumps 150 are formed using a solder reflow process applied to solder material deposited upon contact pads 92. The solder material is deposited using a ball drop or stencil printing process. The solder material used to form bumps 150 includes Au, or Cu structures or another conductive material such as Sn/Pb, CuZn, or CuAg solder, each containing an optional flux material. An optional UBM may be formed beneath bumps 150 over contact pads 92 to enhance the physical and electrical connection between contact pads 92 and bumps 150. The UBM is formed by a process that includes first etching a portion of contact pads 92 and applying one or more metal layers using a vacuum deposition by evaporation or sputtering process or a chemical plating process. Encapsulant or other dam fill material 152 is deposited over substrate 90 and over and around bumps 150. Encapsulant 152 includes epoxy acrylate or other polymer material and is deposited using transfer molding, liquid encapsulant molding, or other molding processes. During deposition, a creeping or capillary action causes encapsulant 152 to flow in and around bumps 150.

Figure 12:
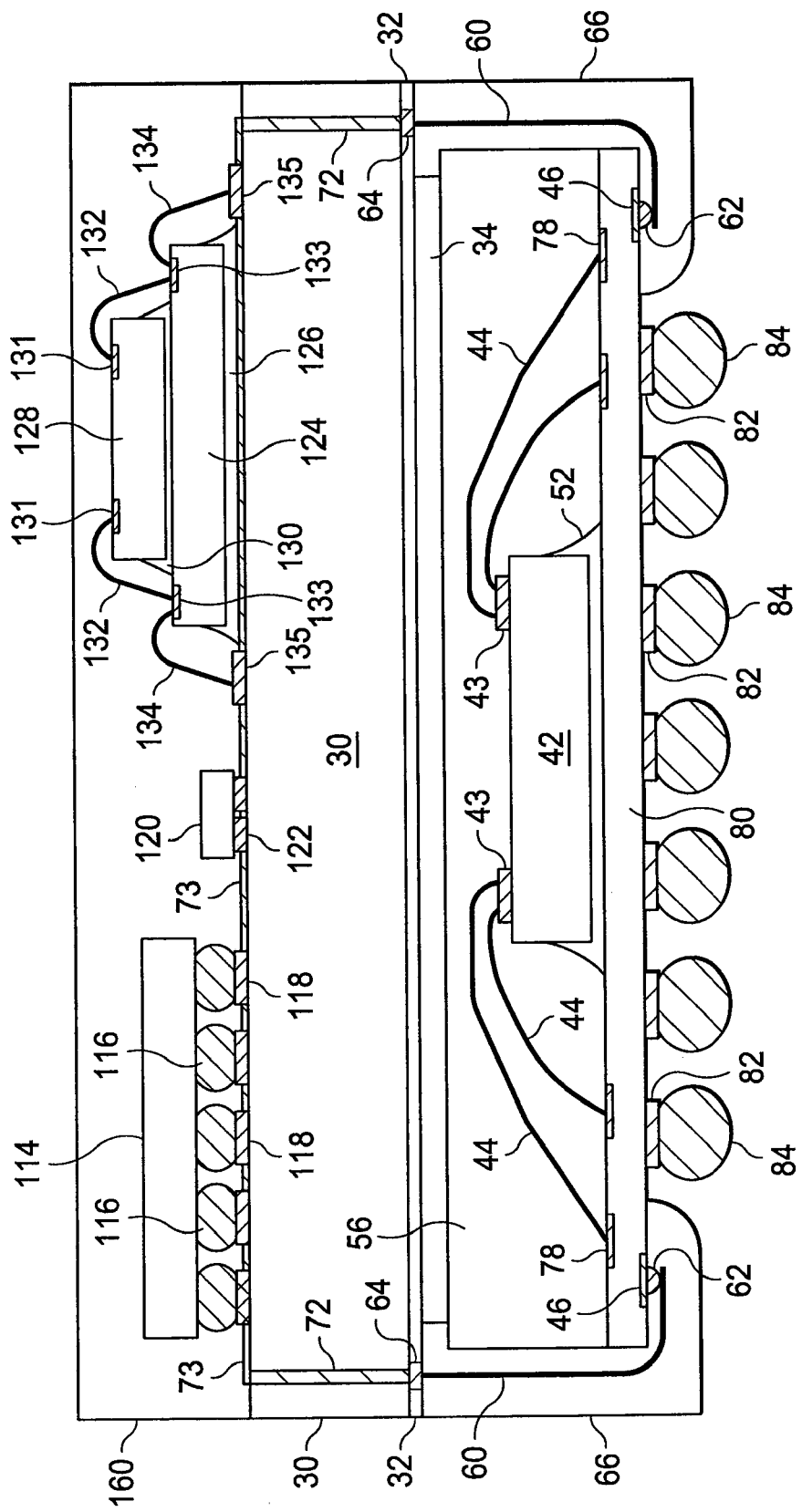
FIG. 12 illustrates a semiconductor package with attached discrete components and wafer-level molding.

FIG. 12 shows the embodiment of FIG. 5 with additional components 114, 120, 124, and 128. In FIG. 12, encapsulant 136 is not deposited over the components, instead wafer level mold or encapsulant 160 is deposited over components 114, 120, 124, and 128 and wafer 30. Encapsulant 160 includes an insulative material and is deposited using printing or compressive molding processes.

Figure 13:
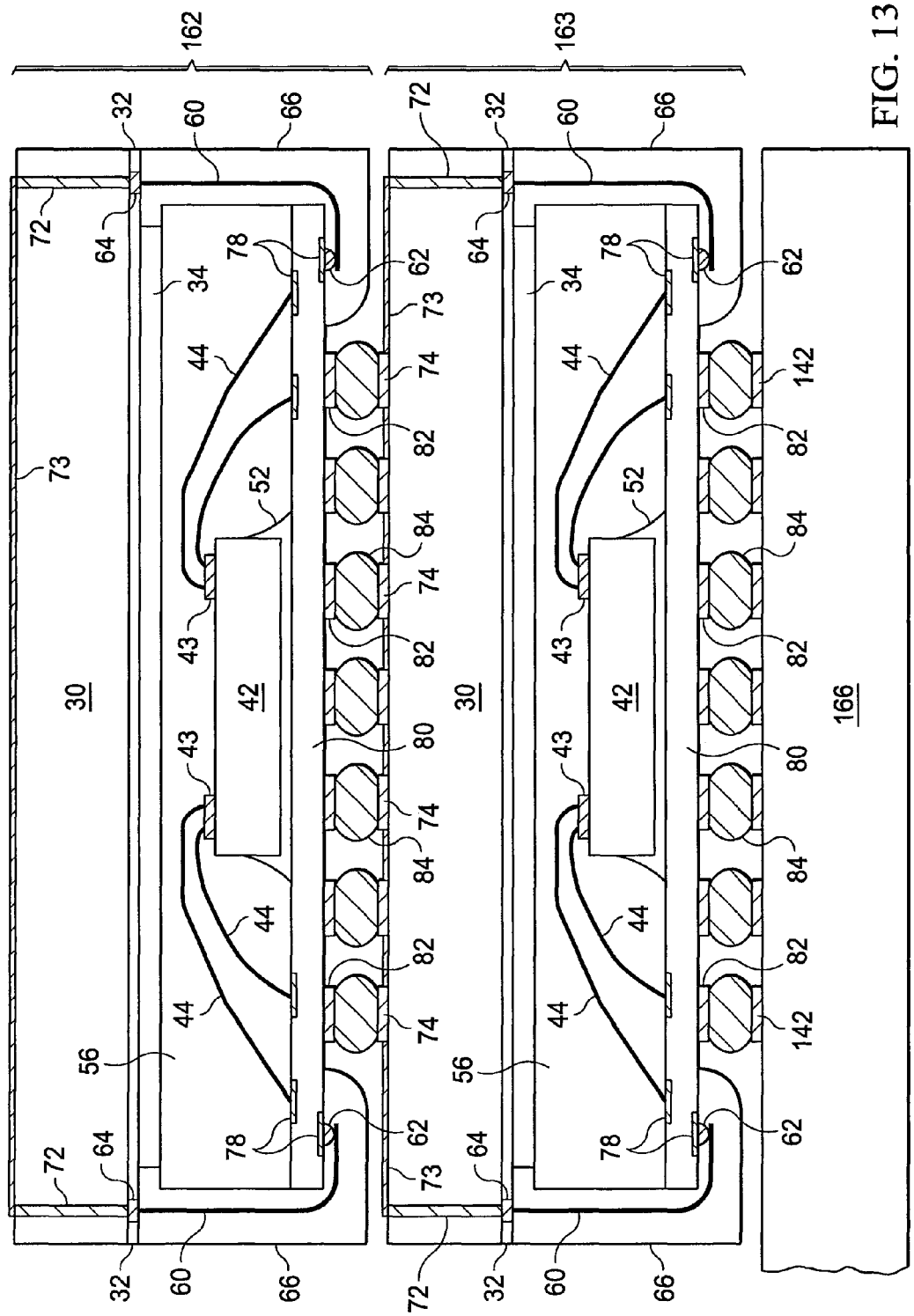
FIG. 13 illustrates two stacked semiconductor packages.

FIG. 13 shows devices 162 and 163 in a board-level stacked configuration. Bumps 84 provide a mechanical and electrical connection between contact pads 82 and contact pads 74. Bumps 84 are formed by a solder deposition and reflow process. In FIG. 13, no bumps are formed on a top surface of device 162. In an alternative embodiment, however, contact pads and bumps are formed on a top surface of device 162 to connect device 162 to additional system components.

FIGS. 14a-14d illustrate an alternative manufacturing process for a CSP or WLCSP. Wafer or substrate 200 has passivation 204 formed over its top surface. Passivation 204 includes polyimide, BCB or PBO. Wafer 200 includes a silicon or other suitable bulk semiconductor material. Wafer 200 includes a relatively large die such as one for a processor, microcontroller, or DSP. Over passivation 204, adhesive layer 206 is deposited. On the backside of wafer 200, a wafer level RDL 202 is deposited. RDL 202 includes passivation, Cu traces, and UBM or a laminated flex tape or PCB such as bismaleimide-triazine (BT) laminate PCB. Holes are formed in wafer 200 using etching or laser drilling. A conductive material such as Cu, Au, or Ag is deposited into the holes using evaporation, electrolytic plating, electroless plating, or screen printing processes to form THVs 208. Accordingly, THVs 208 form an electrical connection between contact pads 209 and RDL 202. Over wafer 200, contact pads 209 are formed using a deposition process and may be further optimized for gold bonding by forming an additional metal layer over contact pads 209. The additional metal layer includes Al or another common contact pad material that is bondable with Au. Furthermore, an organic epoxy material may be deposited within THVs 208 to provide additional mechanical support to contact pads 209. Contact pads 209 are formed by etching an opening in passivation 204 and depositing a conductive material over the opening.

Figure 14A:
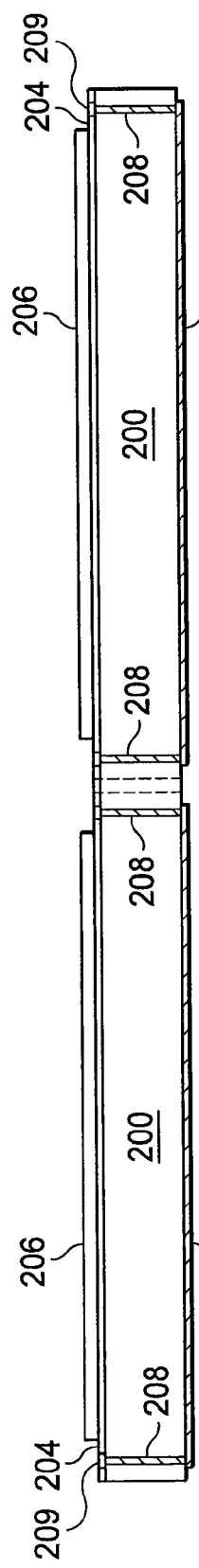
FIGS. 14a-14d illustrate a second method of manufacturing a semiconductor package.
Figure 14B:
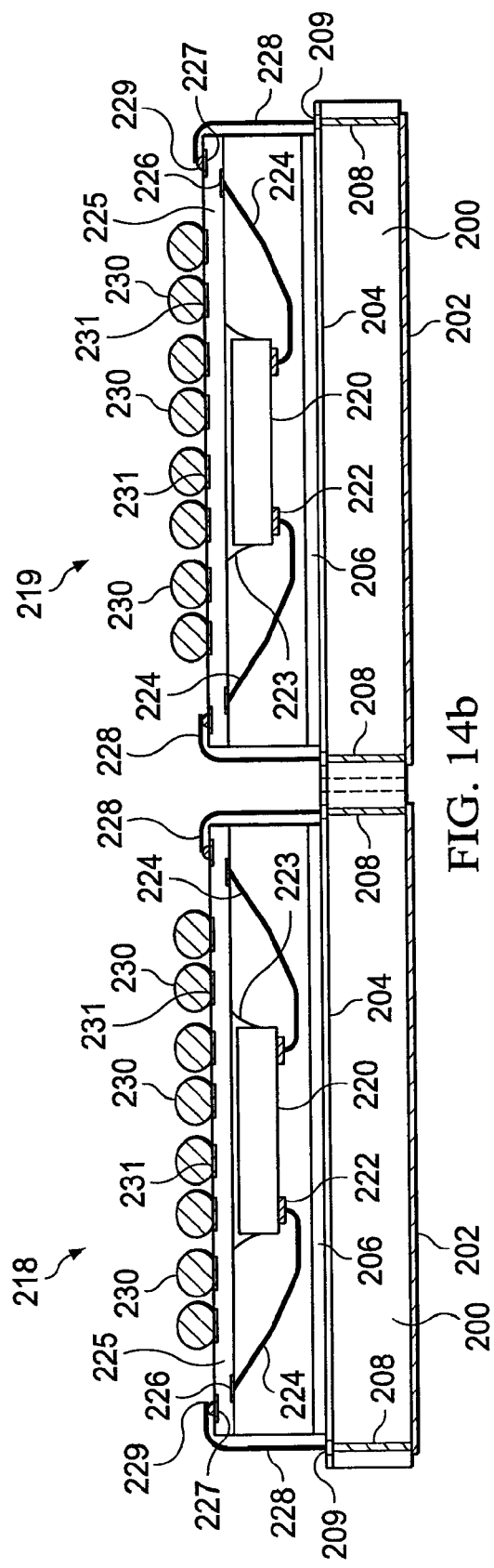

Turning to FIG. 14b, packages 218 and 219 are connected to adhesive layer 206 and, thereby, to wafer 200. Packages 218 and 219 include any KGU that includes a fully assembled package, as described above. For example, packages 218 and 219 include pre-manufactured KGUs that were fabricated and packaged before the formation of wafer 200. The pre-manufactured KGUs or packages are connected to wafer 200 and put into electrical communication with the devices formed within wafer 200 and additional system components in accordance with the present method.

FIG. 14b depicts an example configuration of packages 218 and 219. Packages 218 and 219 include semiconductor die 220 which include an active surface containing active and passive devices, conductive layers, and dielectric layers according to the design of semiconductor die 220. Packages 218 and 219 include a mechanism for connecting to external components such as flip chip connections, QFN packaging, wire bonding, flex tape input/output rerouters, or BGAs (including PGAs, BGAs, and low profile fine pitch BGAs).

Semiconductor die 220 include contact pads 222 formed by a deposition process such as an electrolytic plating or electroless plating process. Semiconductor die 220 are mounted over substrate 225 using die-attach adhesive 223. Substrate 225 includes a leadframe, semiconductor material, PCB material or other structure or material for mounting semiconductor die 220 and forming electrical contact pads thereon. Contact pads 226 are formed on a first surface of substrate 225. Wires 224 form an electrical connection between contact pads 222 and contact pads 226.

Contact pads 227 are formed on a second surface of substrate 225 using a suitable deposition process and conductive material. Wires 228 electrically connect contact pads 227 and contact pads 209. Contact pads 227 further include bumps 229 and optional UBM formed over contact pads 227. Wires 228 connect to bumps 229 and are thereby electrically and mechanically bonded to contact pads 227.

Bumps 230 are also formed over the second surface of substrate 225 over contact pads 231. Bumps include a conductive material such as Au, or Cu structures or Sn/Pb, CuZn, or CuAg solder, each containing an optional flux material. Contact pads 231 are formed using a deposition process such as an electrolytic plating or electroless plating process. Bumps 230 facilitate connection of the device to external components.

Figure 14C:
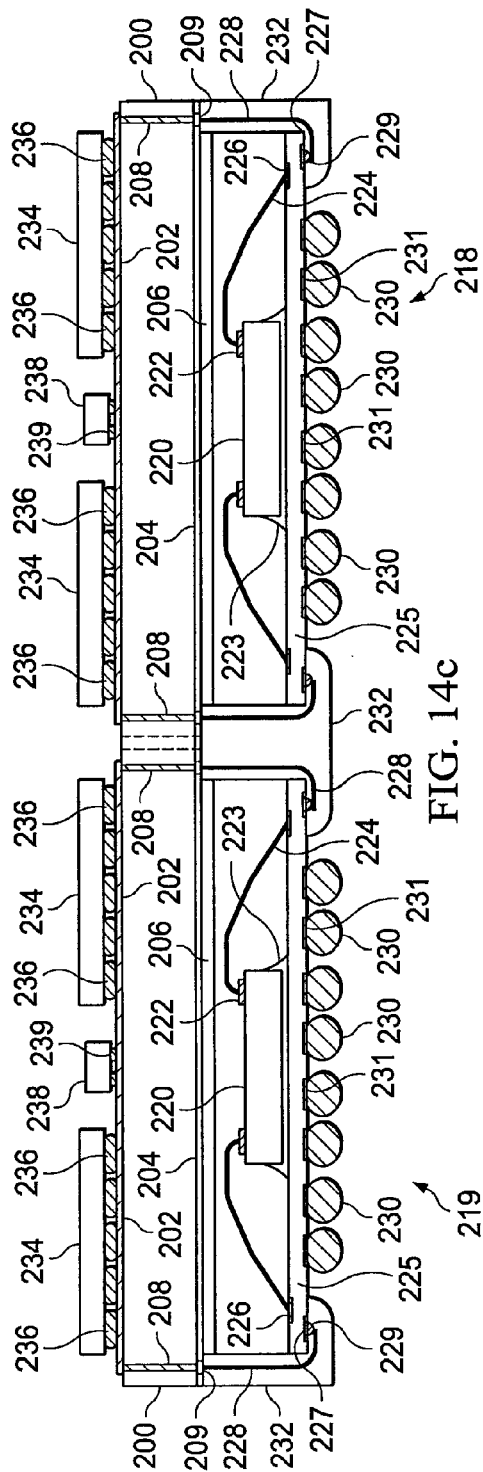

Turning to FIG. 14c, encapsulant or conformal coating 232 is deposited over packages 218 and 219. Encapsulant 232 includes epoxy acrylate or other polymer material and is deposited using transfer molding, liquid encapsulant molding, or other molding processes. Depending upon its method of application, encapsulant 232 may be deposited over the second surface of substrate 225 and bumps 230. However, in the present embodiment, encapsulant 232 is deposited over wires 228 to provide mechanical support and electrical insulation.

Additional components 234 are mounted over RDL 202. Components 234 include filter chips, memory ICs, microcontrollers, CSPs, WLCSPs, and the like. Components 234 are mounted to RDL 202 using an SMT such as BGA, or PGA. In FIG. 14c, components 234 are mounted using bumps 236. Bumps 236 include a conductive material and are formed using a solder reflow process. Bumps 236 electrically connect RDL 202 and contact pads of components 234.

Components 238 are also mounted to RDL 202 using electrically conductive contact points 239. Contact points 239 include a conductive material. Components 238 are connected to RDL 202 using an SMT such as BGA, or flip chip mounting.

Figure 14D:
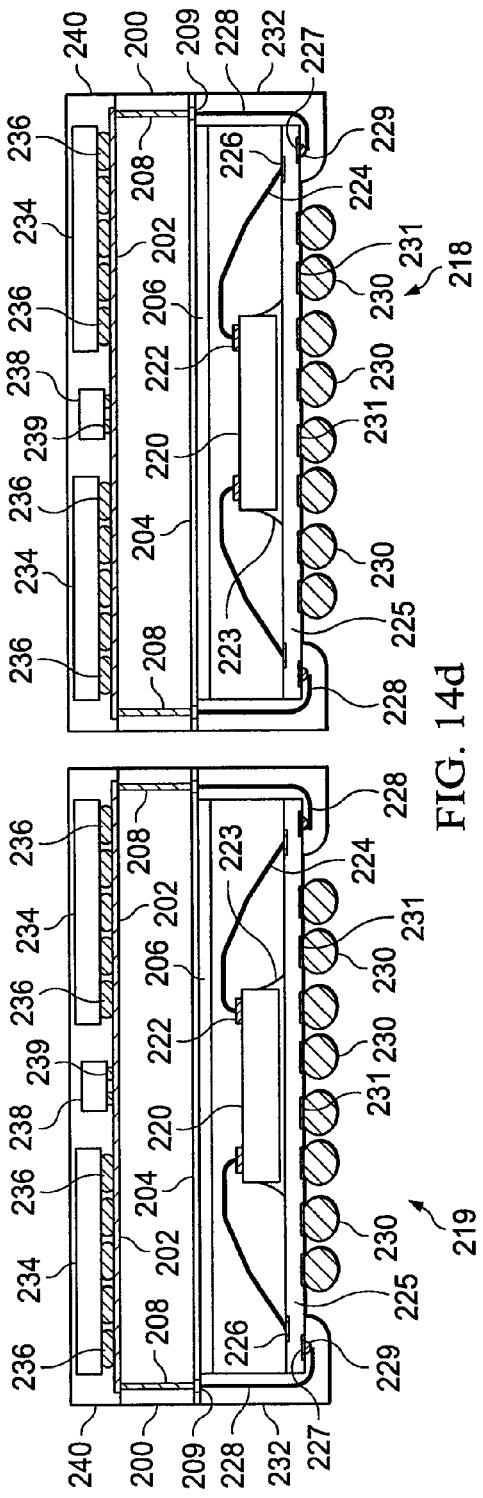

Turning to FIG. 14d, encapsulant or molding compound 240 is deposited over components 234 and 238, RDL 202 and wafer 200. Wafer 200 is singulated to separate the individual die formed on wafer 200.

In summary, the semiconductor package includes a substrate that has an active surface containing a plurality of active circuits. Over the substrate, an adhesive layer is formed. A KGU is mounted to the adhesive layer and an interconnect structure electrically connects the KGU and the active circuits formed on the substrate. In this configuration, the active circuits of the substrate are in communication with the devices formed within the KGU and thereby can use the functionality provided by the KGU. Using the present method, therefore, the incorporation of a KGU into a semiconductor package simplifies the design of the substrate and its active circuits. Instead of including complex circuitry within the substrate, a KGU containing the same functionality can be incorporated into the semiconductor package. For example, a semiconductor device manufacturer wishing to include functionality provided by another manufacturer's device can directly incorporate the other manufacturer's fully packaged device. In this manner, complex functionality provided by other packaged systems can be incorporated into a semiconductor package without having to duplicate that functionality within an active surface of a substrate.

While one or more embodiments of the present invention have been illustrated in detail, the skilled artisan will appreciate that modifications and adaptations to those embodiments may be made without departing from the scope of the present invention as set forth in the following claims.

What is claimed is:
1. A method of making a semiconductor device, comprising:
    providing a semiconductor wafer containing a plurality of first semiconductor die each having an active surface;
    forming an adhesive layer on the active surface of the first semiconductor die;
    providing a plurality of semiconductor packages by,
        (a) providing a leadframe for each semiconductor package,
        (b) mounting a second semiconductor die to a die pad on the leadframe,
        (c) forming a dam around the die pad,

(d) forming a first bond wire between the second semiconductor die and a first contact pad on the leadframe, and (e) depositing a first encapsulant in contact with the second semiconductor die and leadframe;

leading with the first encapsulant, mounting the semiconductor packages to the adhesive layer over the active surface of the first semiconductor die;

forming a second bond wire between the first contact pad on the leadframe and a contact pad on the first semiconductor die;

depositing a second encapsulant in contact with the semiconductor packages and semiconductor wafer, the dam preventing the second encapsulant from covering the die pad of the leadframe;

forming a redistribution layer over a back surface of the first semiconductor die, opposite the active surface;

forming a conductive via through the first semiconductor die to electrically connect the redistribution layer and contact pad of the first semiconductor die;

forming a first bump on the redistribution layer; and singulating the semiconductor wafer into the individual first semiconductor die after mounting the semiconductor package, each semiconductor package being a known good unit which performs electrical functions in support of the first semiconductor die so that the active circuits in the first semiconductor die can be formed without the electrical functions performed by the semiconductor package.

2. The method of claim 1, wherein the semiconductor package includes a quad-flat non-leaded package or ball grid array package.

3. The method of claim 1, further including mounting a discrete semiconductor component to the first semiconductor die.

4. The method of claim 1, further including mounting the back surface of the first semiconductor die to a printed circuit board.

5. The method of claim 1, further including forming a second bump over a second contact pad on the leadframe.

6. The method of claim 1, further including mounting the semiconductor package to a printed circuit board.

7. A method of making a semiconductor device, comprising:

providing a semiconductor wafer containing a plurality of first semiconductor die each having an active surface;

providing a plurality of semiconductor packages by,
(a) providing a leadframe for each semiconductor package,
(b) mounting a second semiconductor die to a die pad on the leadframe,
(c) forming a first electrical interconnection between the second semiconductor die and leadframe, and
(d) depositing a first encapsulant in contact with the second semiconductor die and leadframe;

mounting the semiconductor packages to the active surface of the first semiconductor die;

forming a second electrical interconnection between the leadframe and first semiconductor die;

depositing a second encapsulant in contact with the semiconductor packages and first semiconductor die; and singulating the semiconductor wafer into the individual first semiconductor die after mounting the semiconductor package, each semiconductor package being a known good unit which performs electrical functions in support of the first semiconductor die so that the active circuits in the first semiconductor die can be formed without the electrical functions performed by the semiconductor package.

8. The method of claim 7, further including:

forming a redistribution layer over a back surface of the first semiconductor die, opposite the active surface;

forming a conductive via through the first semiconductor die to electrically connect the redistribution layer and active surface of the first semiconductor die; and forming a third electrical interconnection over the redistribution layer.

9. The method of claim 7, further including forming a dam around the die pad to prevent the second encapsulant from covering the die pad of the leadframe.

10. The method of claim 7, further including mounting a third semiconductor die to the first semiconductor die.

11. The method of claim 7, further including mounting the first semiconductor die to a printed circuit board.

12. The method of claim 7, further including mounting the semiconductor package to a printed circuit board.

13. A method of making a semiconductor device, comprising:

providing a first semiconductor die having an active surface;

providing a semiconductor package by,
(a) providing a substrate,
(b) mounting a second semiconductor die to the substrate,
(c) forming a first electrical connection between the second semiconductor die and substrate, and
(d) depositing a first encapsulant covering the second semiconductor die and substrate;

mounting the semiconductor package to the active surface of the first semiconductor die;

forming a second electrical interconnection between the substrate and first semiconductor die; and depositing a second encapsulant covering the semiconductor package and first semiconductor die;

wherein the semiconductor package is a known good unit which performs electrical functions in support of the first semiconductor die so that the active circuits in the first semiconductor die can be formed without the electrical functions performed by the semiconductor package.

14. The method of claim 13, further including:

forming a redistribution layer over a back surface of the first semiconductor die, opposite the active surface;

forming a conductive via through the first semiconductor die to electrically connect the redistribution layer and first semiconductor die; and forming a third electrical interconnection over the redistribution layer.

15. The method of claim 13, further including forming a dam around a portion of the substrate to which the second semiconductor die is mounted to prevent the second encapsulant from covering the portion of the substrate to which the second semiconductor die is mounted.

16. The method of claim 13, further including mounting the first semiconductor die to a printed circuit board.

17. The method of claim 13, further including mounting the semiconductor package to a printed circuit board.

18. The method of claim 13, further including mounting a third semiconductor die to the first semiconductor die.

19. The method of claim 13, further including mounting a third semiconductor die to the semiconductor package.

20. A method of making a semiconductor device, comprising:
- providing a first semiconductor die having an active surface;
- providing a semiconductor package by,
  - (a) providing a second semiconductor die,
  - (b) forming a first electrical interconnection to the second semiconductor die, and
  - (c) depositing a first encapsulant covering the second semiconductor die;
- mounting the semiconductor package to the first semiconductor die;
- forming a second electrical interconnection with the first electrical interconnection between the first semiconductor die and second semiconductor die; and
- depositing a second encapsulant covering the semiconductor package and first semiconductor die;
- wherein the semiconductor package is a known good unit which performs electrical functions in support of the first semiconductor die so that the active circuits in the first semiconductor die can be formed without the electrical functions performed by the semiconductor package.

21. The method of claim 20, further including:
- forming a redistribution layer over a back surface of the first semiconductor die, opposite the active surface; and
- forming a conductive via through the first semiconductor die to electrically connect the redistribution layer and first semiconductor die.

22. The method of claim 20, further including forming a dam around a portion of the substrate to which the second semiconductor die is mounted to prevent the second encapsulant from covering the portion of the substrate to which the second semiconductor die is mounted.

23. The method of claim 20, further including mounting a third semiconductor die to the first semiconductor die.

24. The method of claim 23, further including depositing a third encapsulant covering the third semiconductor die and first semiconductor die.

25. The method of claim 20, further including mounting a third semiconductor die to the semiconductor package.

* * * * *